(12) United States Patent
Chien et al.

(10) Patent No.: US 12,294,022 B2
(45) Date of Patent: May 6, 2025

(54) SEMICONDUCTOR DEVICE AND METHOD OF MANUFACTURING THE SAME

(71) Applicant: Taiwan Semiconductor Manufacturing Company, Ltd., Hsinchu (TW)

(72) Inventors: Jui-Fen Chien, Taichung (TW); Hsiao-Kuan Wei, Taoyuan County (TW); Hsien-Ming Lee, Changhua (TW); Chin-You Hsu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 142 days.

(21) Appl. No.: 18/337,039

(22) Filed: Jun. 19, 2023

(65) Prior Publication Data

US 2023/0335613 A1 Oct. 19, 2023

Related U.S. Application Data

(63) Continuation of application No. 17/396,783, filed on Aug. 9, 2021, now Pat. No. 11,721,740, which is a continuation of application No. 16/884,053, filed on May 27, 2020, now Pat. No. 11,088,257, which is a continuation of application No. 15/877,391, filed on Jan. 23, 2018, now Pat. No. 10,707,318.

(Continued)

(51) Int. Cl.
*H01L 29/06* (2006.01)
*H01L 21/28* (2006.01)
*H01L 27/092* (2006.01)
*H01L 29/49* (2006.01)
*H01L 29/66* (2006.01)
*H01L 29/78* (2006.01)
*H01L 29/165* (2006.01)

(52) U.S. Cl.
CPC .... *H01L 29/4966* (2013.01); *H01L 21/28088* (2013.01); *H01L 27/0924* (2013.01); *H01L 29/0653* (2013.01); *H01L 29/66545* (2013.01); *H01L 29/66795* (2013.01); *H01L 29/7848* (2013.01); *H01L 29/785* (2013.01); *H01L 29/165* (2013.01)

(58) Field of Classification Search
CPC .......... H01L 29/4966; H01L 21/28088; H01L 27/0924; H01L 29/0653; H01L 29/66545; H01L 29/66795; H01L 29/7848; H01L 29/785; H01L 29/165; H01L 21/823821
See application file for complete search history.

(56) References Cited

U.S. PATENT DOCUMENTS 8,796,666 B1 8/2014 Huang et al.
8,815,712 B2 8/2014 Wan et al.
(Continued)

*Primary Examiner* — Elias Ullah
(74) *Attorney, Agent, or Firm* — JCIPRNET

(57) ABSTRACT

Provided is a semiconductor device including a first transistor of a first type comprising a first work function layer, the first work function layer comprising a first underlying layer; and a second transistor of the first type comprising a second work function layer, the second work function layer comprising a second underlying layer. The first and second underlying layers each comprises a metal nitride layer with at least two kinds of metals, and a thickness of the first underlying layer is greater than a thickness of the second underlying layer. A method of manufacturing a gate structure for a semiconductor device is also provided.

20 Claims, 13 Drawing Sheets

Related U.S. Application Data

(60) Provisional application No. 62/586,194, filed on Nov. 15, 2017.

(56) References Cited

U.S. PATENT DOCUMENTS

| | | |
|---|---|---|
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |

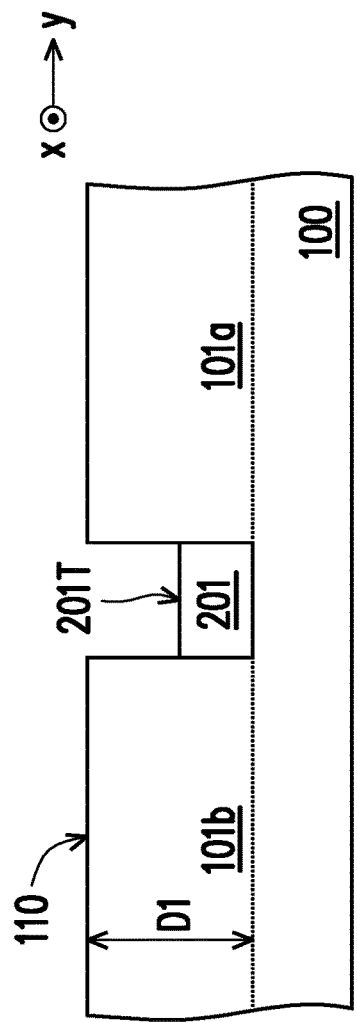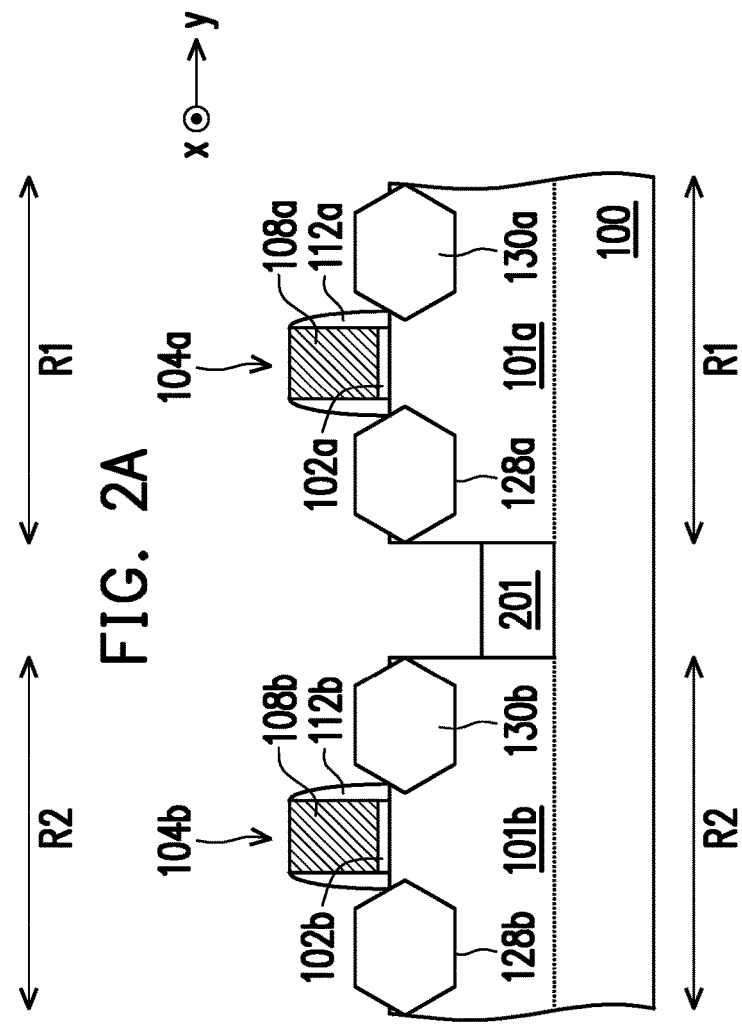

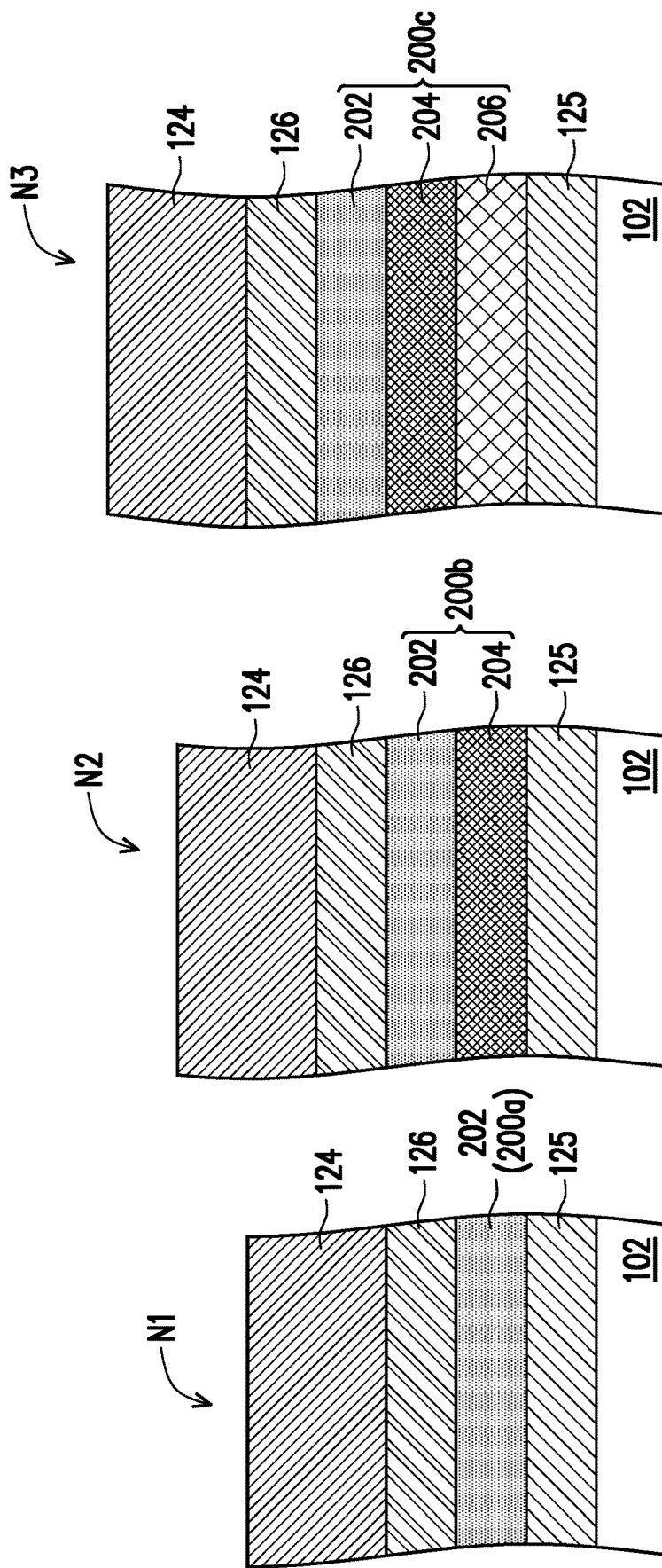

SEMICONDUCTOR DEVICE AND METHOD OF MANUFACTURING THE SAME

CROSS-REFERENCE TO RELATED APPLICATION

This is a continuation application of and claims the priority benefit of U.S. application Ser. No. 17/396,783, filed on Aug. 9, 2021, now allowed. The U.S. application Ser. No. 17/396,783, is a continuation application of and claims the priority benefit of U.S. application Ser. No. 16/884,053, filed on May 27, 2020. The U.S. application Ser. No. 16/884,053 is a continuation application of and claims the priority benefit of U.S. application Ser. No. 15/877,391, filed on Jan. 23, 2018, now U.S. Pat. No. 10,707,318, issued on Jul. 7, 2020, which claims the priority benefit of U.S. provisional application Ser. No. 62/586,194, filed on Nov. 15, 2017. The entirety of each of the above-mentioned patent applications is hereby incorporated by reference herein and made a part of this specification.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET) and the use of a metal gate structure with a high-k (dielectric constant) material. The metal gate structure is often manufactured by using gate replacement technologies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 2E are cross-sectional views of a method of manufacturing a semiconductor device in accordance with some embodiments.

FIGS. 4A to 4F are enlarged exemplary cross-sectional views corresponding to an area of FIG. 3B for various transistors in accordance with some embodiments.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 1:
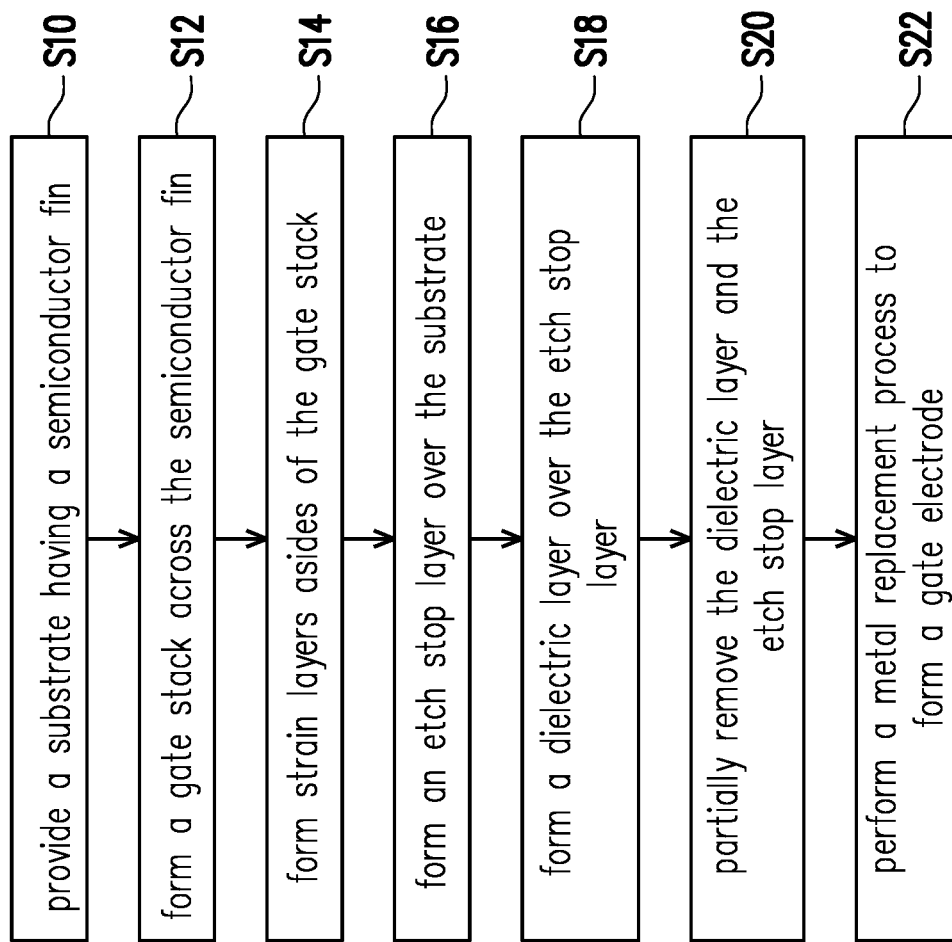
FIG. 1 is a flow chart illustrating a method of manufacturing a semiconductor device in accordance with some embodiments.

FIG. 1 is a flow chart illustrating a method of manufacturing a semiconductor device in accordance with some embodiments. FIGS. 2A to 2E are cross-sectional views of a method of manufacturing a semiconductor device in accordance with some embodiments.

At Step 10 in FIG. 1 and as shown in FIG. 2A, a substrate 100 is provided. The substrate 100 includes a region R1 and a region R2. The region R1 is used for p-type FinFETs, and the region R2 is used for n-type FinFETs, for example. Although the number of each of the regions R1 and R2 illustrated in FIG. 2A is one, it should not limit various embodiments of the present disclosure. In some alternative embodiments, the number of the regions R1 may be three, three regions R1 are used for various p-type FinFET with different threshold voltages, such as an ultra low threshold voltage (uLVT) p-type FinFET, a low threshold voltage (LVT) p-type FinFET, and a standard threshold voltage (SVT) p-type FinFET. Three regions R2 are used for various n-type FinFET with different threshold voltages, such as an uLVT n-type FinFET, a low LVT n-type FinFET, and a SVT n-type FinFET. It will be described in detail in the following paragraphs.

In some embodiments, the substrate 100 includes a bulk substrate, a silicon-on-insulator (SOI) substrate or a germanium-on-insulator (GOI) substrate. In one embodiment, the substrate 100 includes a crystalline silicon substrate (e.g., wafer). The substrate 100 may include various doped regions (such as well regions) depending on design requirements (e.g., p-type substrate or n-type substrate). The doped regions may be doped with p-type or n-type dopants. For example, the doped regions may be doped with p-type dopants, such as boron or $BF_2^+$, n-type dopants, such as phosphorus or arsenic, and/or a combination thereof. In some embodiments, n-type doped regions may be formed in the region R1, and p-type doped regions may be formed in the region R2. In some alternative embodiments, the substrate 100 may be made of some other suitable elemental semiconductors, such as diamond or germanium, a suitable compound semiconductor, such as gallium arsenide, silicon carbide, indium arsenide, or indium phosphide, or a suitable alloy semiconductor, such as silicon germanium carbide, gallium arsenic phosphide, or gallium indium phosphide. Also, in some embodiments, the substrate may include other conductive layers or other semiconductor elements, such as transistors, diodes or the like.

At Step S10 in FIG. 1 and as shown in FIG. 2A, the substrate 100 has semiconductor fins 101a and 101b and isolation structures 201. The semiconductor fins 101a and 101b are formed of a material the same as or different from a material of the substrate 100. In some embodiments, a depth D1 of the semiconductor fins 101a and 101b ranges from 80 nm to 200 nm. The isolation structures 201 include silicon oxide, silicon nitride, silicon oxynitride, a spin-on dielectric material, a low-k dielectric material, or a combination thereof and formed by performing a high-density-plasma chemical vapor deposition (HDP-CVD) process, a sub-atmospheric CVD (SACVD) process or a spin-on process, for example.

As shown in FIG. 2A, in some embodiments, the semiconductor fins 101a and 101b are formed by forming trenches, forming shallow trench isolation (STI) regions in the trenches, and lowering a top surface of the STI regions by performing an etching process to a level lower than an original top surface of the substrate 100. The remaining portions of the STI regions become the isolation structures 201, and the remaining portions of the substrate 100 between the isolation structures 201 thus become the semiconductor fins 101a and 101b. Top surfaces of the isolation structures 201 are lower than top surfaces of the semiconductor fins 101a and 101b. In other words, top portions 110 of the semiconductor fins 101a and 101b protrude from the top surfaces 201T of the isolation structures 201.

In some other embodiments, the semiconductor fins 101a and 101b are formed of a material different from a material of the substrate 100. The semiconductor fins 101a and 101b may be formed by lowering top portions of the substrate 100 between the adjacent isolation structures 201 to form recesses, and re-growing a semiconductor material different from the material of the substrate 100 in the recesses. Top portions of the STI regions may then be removed by performing a chemical mechanical polish process and an etching process, while bottom portions of the STI regions are not removed. As a result, the remaining portions of STI regions become the isolation structures 201, and top portions of the re-grown semiconductor material between the adjacent isolation structures 201 become the semiconductor fins 101a and 101b.

At Step S12 in FIG. 1 and as shown in FIG. 2B, gate stacks 104a and 104b are formed across the semiconductor fins 101a and 101b respectively. In one embodiment, an extending direction X of the gate stacks 104a and 104b is, for example, perpendicular to an extension direction Y of the semiconductor fins 101a and 101b, so as to cover middle portions of the semiconductor fins 101a and 101b. In some embodiments, the gate stack 104a includes a gate dielectric layer 102a and a gate electrode 108a. Similarly, the gate stack 104b includes a gate dielectric layer 102b and a gate electrode 108b. In alternative embodiments, the gate stacks 104a and 104b further include spacers 112a and 112b respectively.

In alternative embodiments, the gate stack 104a or 104b may further include interfacial layers (ILs) on the semiconductor fin 101a or 101b. In other words, the gate dielectric layer 102a or 102b is formed between the IL and the gate electrode 108a or 108b respectively. In some embodiments, the IL includes a dielectric material, such as silicon oxide or silicon oxynitride. The IL is formed by performing a thermal oxidation process, a chemical vapor deposition (CVD) process, or an atomic layer deposition (ALD) process. It should be noted that the detail described below with respect to the elements of the gate stacks 104a may also apply to the elements of the gate stack 104b, and thus the description of the elements in the gate stack 104b is omitted.

The gate dielectric layer 102a is formed to cover portions of the semiconductor fins 101a. In some embodiments, the gate dielectric layer 102a includes silicon oxide, silicon nitride, silicon oxynitride, high-k dielectric materials, or a combination thereof. The high-k dielectric materials are generally dielectric materials with a dielectric constant higher than 4. The high-k dielectric materials include metal oxide. In some embodiments, examples of the metal oxide used as the high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or a combination thereof. The gate dielectric layer 102a is formed by performing a thermal oxidation process, a CVD process, an ALD process, or a combination thereof.

The gate electrode 108a is formed on the gate dielectric layer 102a. In some embodiment, the gate electrode 108a serves as dummy gate electrode, and the gate electrode 108a is made of polysilicon. A metal gate (also referred to as "replacement gates") may replace the dummy gate electrode in subsequent steps. The replacing step will be discussed in greater detail in subsequent paragraphs.

In some embodiments, lightly doped source and drain (LDD) regions (not shown) are formed in the semiconductor fins 101a and 101b beside the gate stacks 104a and 104b. The LDD regions are formed by performing an ion implantation process, for example. In some embodiments, the semiconductor fin 101a in the region R1 is doped with p-type dopants, and the semiconductor fin 101b in the region R2 is doped with n-type dopants.

As shown in FIG. 2B, the spacers 112a are formed over sidewalls of the gate electrode 108a. The spacers 112a are formed of silicon oxide, silicon nitride, silicon oxynitride, silicon carbide, SiCN, fluoride-doped silicate glass (FSG), low-k dielectric materials (such as or SiCON), or a combination thereof. It should be noted that the low-k dielectric materials are generally dielectric materials having a dielectric constant lower than 3.9. The spacers 112a may have a multi-layer structure including one or more liner layers. The liner layer includes a dielectric material such as silicon oxide, silicon nitride, and/or other suitable materials. The formation of the spacers 112a may be achieved by depositing a suitable dielectric material and anisotropically etching off the dielectric material.

As shown in FIG. 2B, recesses 128a and 128b are formed within the semiconductor fin 101a and 101b beside the gate stacks 104a and 104b by removing a portion of the semiconductor fins 101a and 101b at locations intended for source and drain regions. In some embodiments, the formation of the recesses 128a and 128b includes performing a first etching process and a second etching process. Here, the first etching process refers to a trench etching process such as an anisotropic etching process, and the second etching process refers to a lateral etching process such as an isotropic etching process.

At Step S14 in FIG. 1 and as shown in FIG. 2B, a strain layer 130a is formed in recess 128a of the semiconductor fin 101a in the region R1. The strain layer 130a is formed at sides of the gate stack 104a. A lattice constant of the strain layer 130a is different from a lattice constant of the substrate 100, and portions of the semiconductor fin 101a covered by the gate stack 104a is strained or stressed to enhance carrier mobility and performance of the FinFETs. In one embodiment, the strain layer 130a, such as SiGe, are utilized for hole mobility enhancement of the p-type FinFET to be formed in the region R1.

In addition, a strain layer 130b is formed in the semiconductor fin 101b in the region R2. A lattice constants of the strain layer 130b is different from the lattice constant of the substrate 100, and portions of the semiconductor fin 101b covered by the gate stack 104b is strained or stressed to enhance the carrier mobility and performance of the FinFETs. In one embodiment, the strain layer 130b such as SiC or SiP, are utilized for electron mobility enhancement of the n-type FinFET to be formed in the region R2.

In some embodiments, the strain layers 130a and 130b are formed through epitaxial growth. In some embodiments, the epitaxial growth technology includes performing a low-pressure CVD (LPCVD) process, an atomic layer CVD (ALCVD) process, an ultrahigh vacuum CVD (UHVCVD) process, a reduced pressure CVD (RPCVD) process, a molecular beam epitaxy (MBE) process, a metalorganic vapor phase epitaxy (MOVPE) process or a combination thereof. Alternatively, the epitaxial growth technology utilizes a cyclic deposition-etch (CDE) epitaxy process or a selective epitaxial growth (SEG) process to form the strained material of high crystal quality. In some embodiments, a material of the strain layers 130a includes a p-type dopant (such as boron or $BF_2^+$) doped therein formed through selective epitaxial growth by performing in-situ doping, and a material of the strain layer 130b includes an n-type dopant (such as phosphorus or arsenic) doped therein formed through selective epitaxial growth by performing in-situ doping.

Figure 2C:
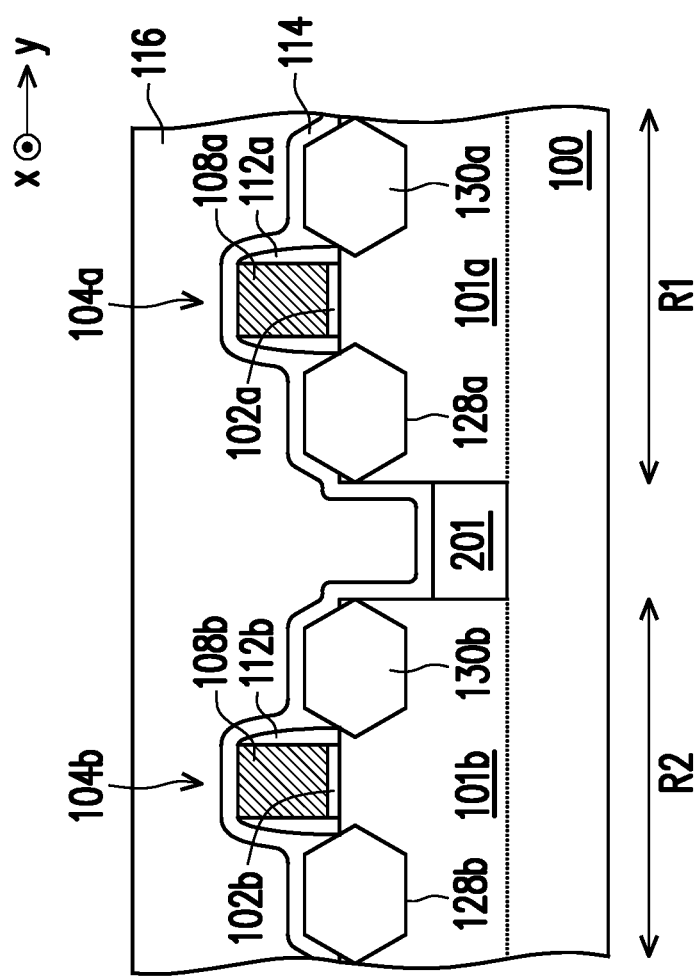

At Step S16 in FIG. 1 and as shown in FIG. 2C, an etch stop layer 114 is formed over the substrate 100. In some embodiments, the etch stop layer 114 may be referred to as a contact etch stop layer (CESL). The etch stop layer 114 includes silicon nitride, carbon-doped silicon nitride, or a combination thereof. In some embodiments, the etch stop layer 114 is deposited by performing a CVD process, a high-density plasma (HDP) CVD process, a sub-atmospheric CVD (SACVD) process, a molecular layer deposition (MLD) process, or other suitable processes. In some embodiments, before the etch stop layer 114 is formed, a buffer layer (not shown) may be formed over the substrate 100. In an embodiment, the buffer layer is an oxide such as silicon oxide. However, other compositions may be possible. In some embodiments, the buffer layer is deposited by performing a CVD process, a HDPCVD process, a SACVD process, an MLD process, or other suitable processes.

At Step S18 in FIG. 1 and as shown in FIG. 2C, a dielectric layer 116 is formed over the etch stop layer 114. In some embodiments, the dielectric layer 116 may be referred to as an interlayer dielectric layer (ILD). The dielectric layer 116 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 116 includes low-k dielectric materials. It should be noted that the low-k dielectric materials are generally dielectric materials having a dielectric constant lower than 3.9. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the dielectric layer 116 may include one or more dielectric materials and/or one or more dielectric layers. In some embodiments, the dielectric layer 116 is formed to have a suitable thickness by performing a flowable CVD (FCVD) process, a CVD process, a HDPCVD process, a SACVD process, a spin-on process, a sputtering process, or other suitable processes.

Figure 2D:
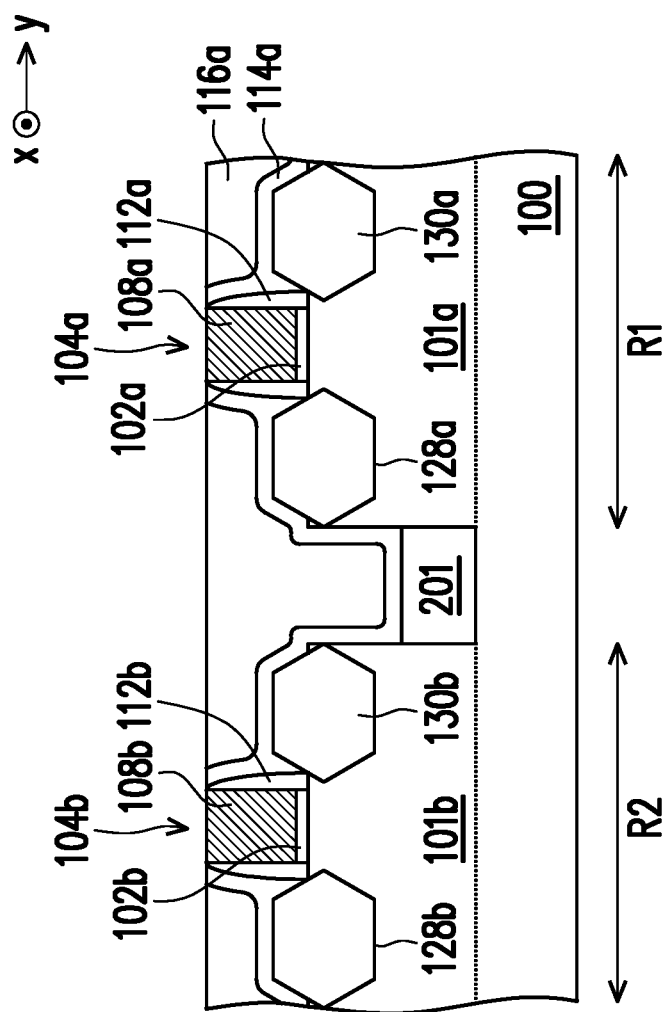

At Step S20 in FIG. 1 and as shown in FIG. 2D, the dielectric layer 116 and the etch stop layer 114 are partially removed such that top surfaces of the gate stacks 104a and 104b are exposed, and a dielectric layer 116a and an etch stop layer 114a are formed. The process of removing a portion of the dielectric layer 116 and a portion of the etch stop layer 114 is achieved by a chemical mechanical polishing (CMP) process, an etching process, or other suitable processes.

Figure 2E:
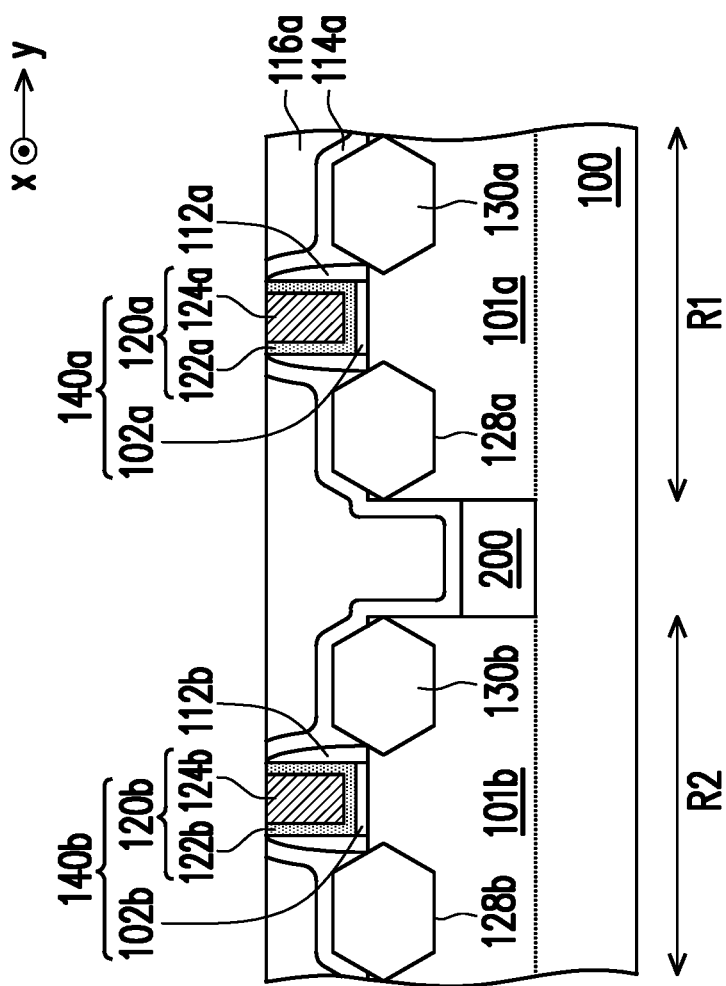

At Step S22 in FIG. 1 and as shown in FIGS. 2D and 2E, a metal replacement process is performed. In some embodiments, the gate electrodes 108a and 108b are dummy gate electrodes, and are replaced respectively by gate electrodes 120a and 120b. Specifically, materials of the gate electrodes 108a and 108b are polysilicon and the materials of the gate electrodes 120a and 120b include metal-containing conductive layers. At least one of the metal-containing conductive layers includes a barrier, a work function layer, a seed layer, an adhesion layer, a barrier layer, a filter layer, a metal filling layer or a combination thereof. The metal-containing conductive layers include Al, Cu, W, Ti, Ta, Ag, Ru, Mn, Zr, TiAl, TiN, TaN, WN, TiAlN, TaC, TaCN, TaSiN, TiSiN, NiSi, CoSi, or a combination thereof, for example. The metal-containing conductive layers are formed by forming metal-containing conductive material layers, and a chemical mechanical polishing (CMP) process, an etching process, or other suitable processes.

In some embodiments, the gate electrode 120a includes a work function layer 122a and a metal filling layer 124a for the p-type FinFET. The gate electrode 120b includes a work function layer 122b and a metal filling layer 124b for the n-type FinFET. As shown in FIG. 2E, the work function layers 122a and 122b have a U-shape cross section, respectively. The metal filling layer 124a and 124b are disposed over the work function layers 122a and 122b, and are surrounded by the work function layers 122a and 122b, respectively. In the case, the gate dielectric layer 102a and the gate electrode 120a constitute a gate structure 140a for the p-type FinFET, while the gate dielectric layer 102b and the gate electrode 120b constitute of a gate structure 140b for the n-type FinFET. The spacers 112a are formed over the opposite sidewalls of the gate structure 140a; while the spacers 112b are formed over the opposite sidewalls of the gate structure 140b.

Figure 3A:
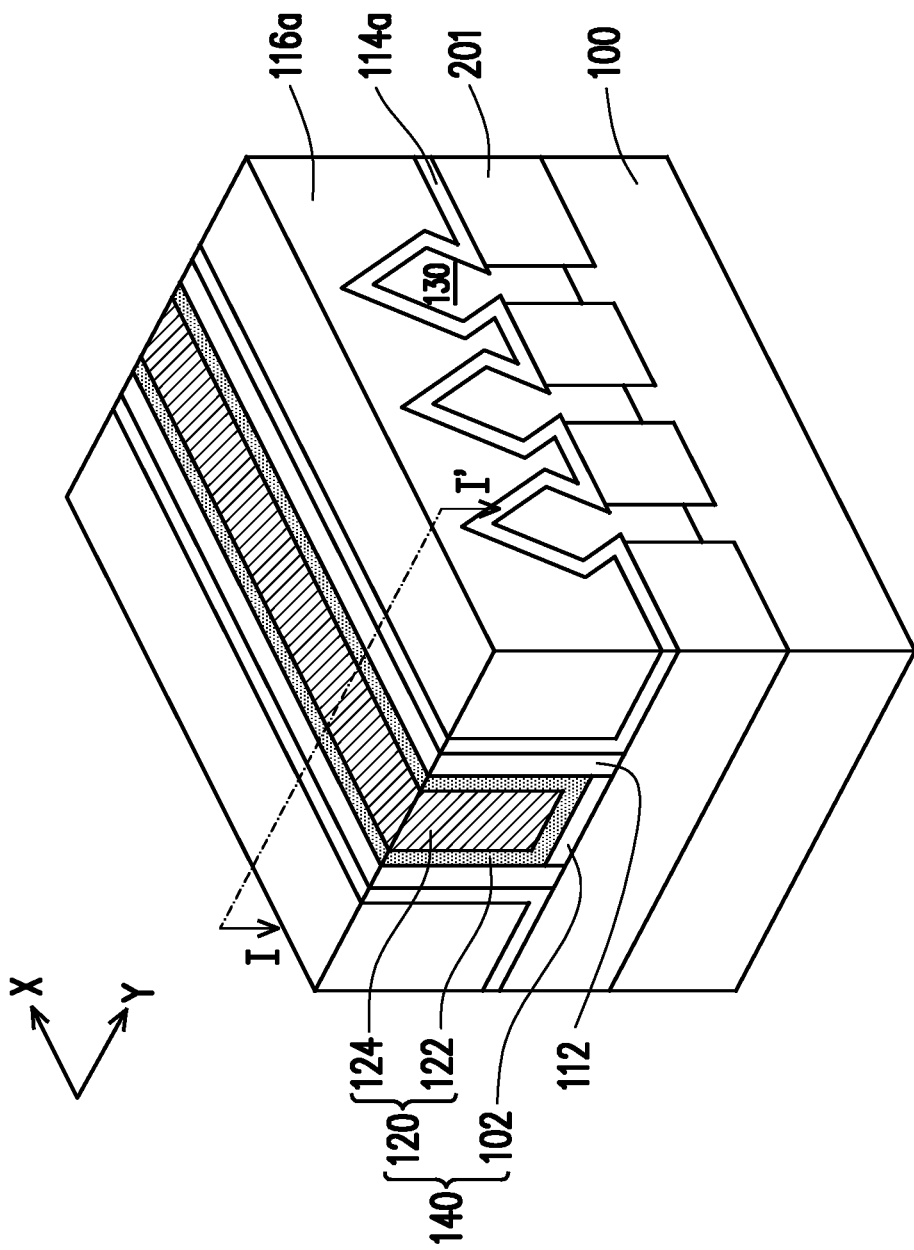
FIG. 3A is a perspective view of a FinFET in accordance with some embodiments.
Figure 3B:
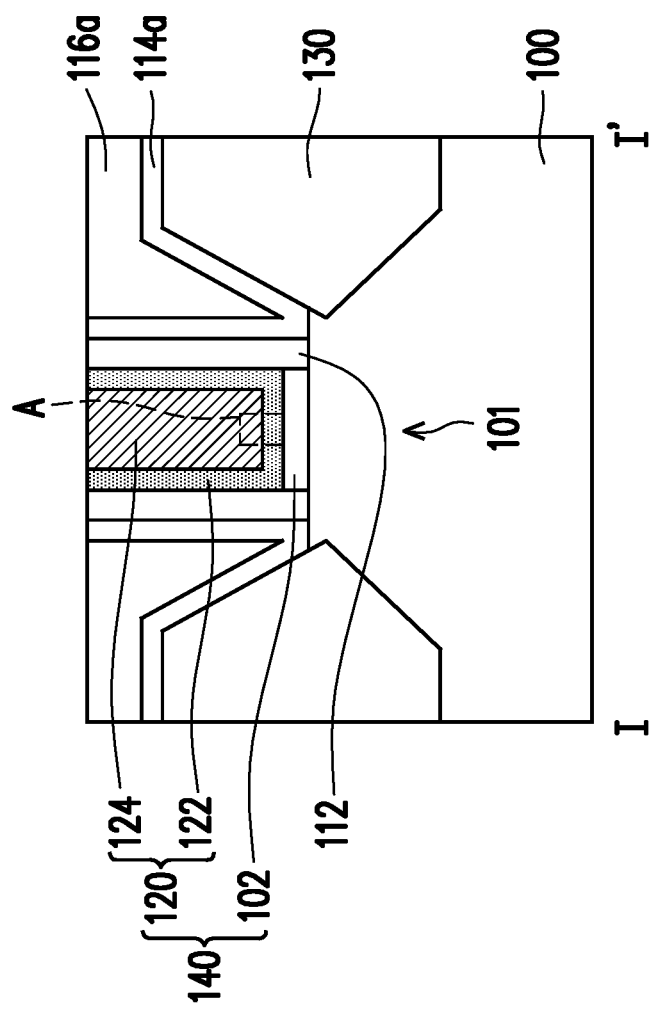
FIG. 3B is a cross-sectional view of the FinFET taken along the line I-I' of FIG. 3A.

FIG. 3A is a perspective view of a FinFET in accordance with some embodiments. FIG. 3B is a cross-sectional view of the FinFET taken along the line I-I' of FIG. 3A. In some embodiments, the FinFET illustrated in FIG. 3A is referred as the FinFET over the substrate 100 in the region R1 and/or region R2 illustrated in FIG. 2E.

As shown in FIG. 3A and FIG. 3B, a FinFET includes a substrate 100, a plurality of isolation structures 201, a gate structure 140, and a plurality of strain layers 130. The substrate 100 has a plurality of semiconductor fins 101. The isolation structures 201 are located over the substrate 100 to isolate the semiconductor fins 101. The semiconductor fins 101 and the isolation structures 201 both extend along the Y direction. In addition, the semiconductor fins 101 protrude from the isolation structures 201. The gate structure 140 extend along the X direction. The gate structure 140 is disposed across portions of the semiconductor fins 101 and portions of the isolation structures 201. In detail, the gate structure 140 includes a gate dielectric layer 102 and a gate electrode 120 over the gate dielectric layer 102. The gate electrode 120 includes a work function layer 122 and a metal filling layer 124 surrounded by the work function layer 122. The strain layers 130 formed at two sides of the gate structure 140 (as shown in FIG. 3B) are referred as source and/or drain (S/D) regions. The FinFET further includes spaces 112, an etch stop layer 114a, and a dielectric layer 116a. The spaces 112 are disposed over the opposite sidewalls of the gate dielectric layer 102. The etch stop layer 114a is formed to cover the spaces 112, the strain layers 130, and the isolation structures 201. The dielectric layer 116a is formed over the etch stop layer 114a.

Figure 4F:
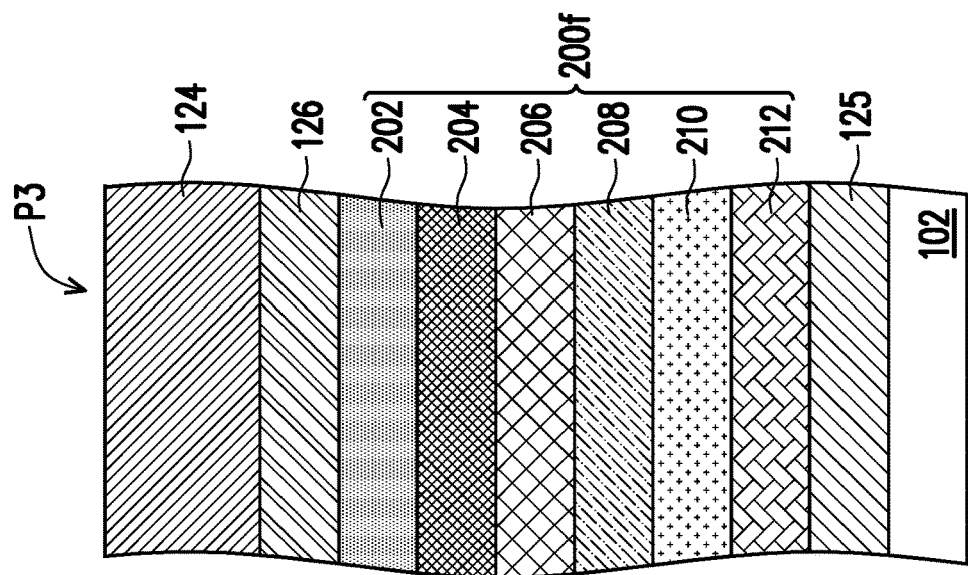
Figure 4E:
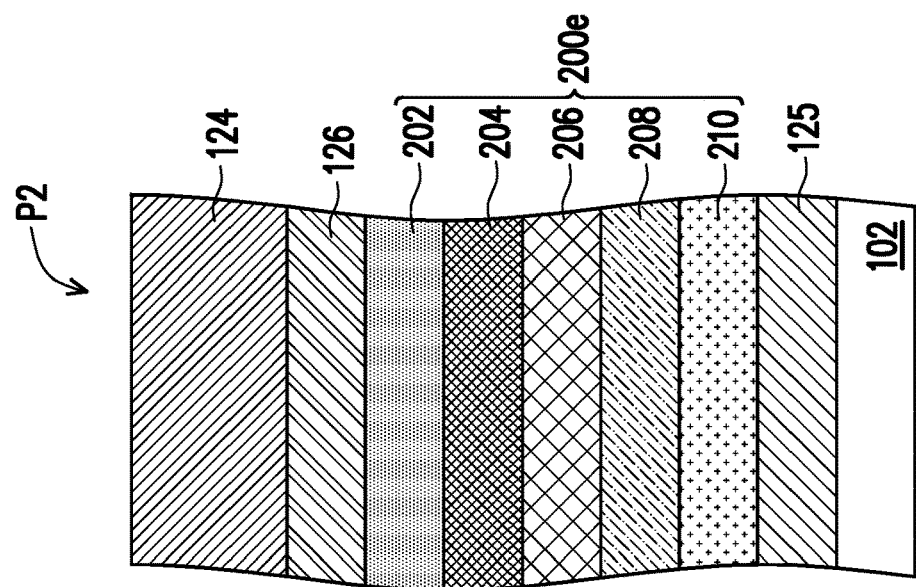
Figure 4D:
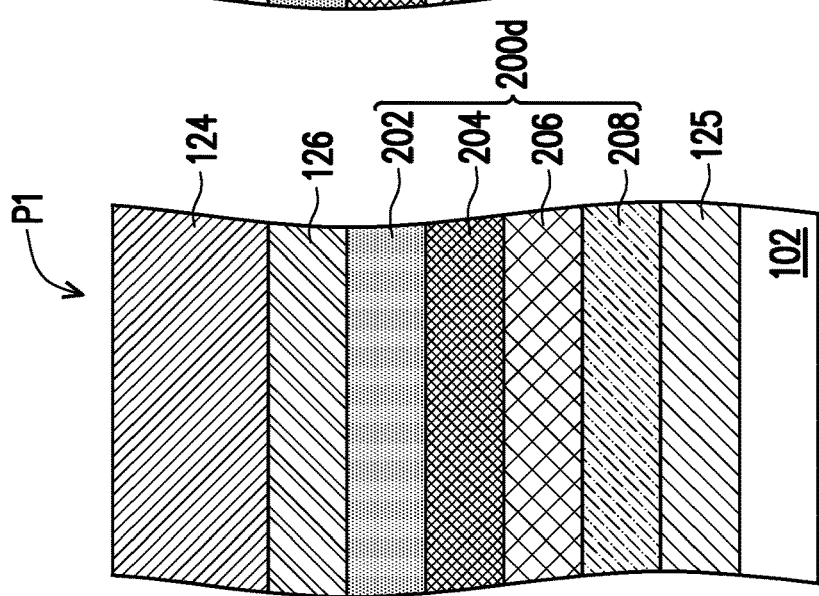

FIGS. 4A to 4F are enlarged exemplary cross-sectional views corresponding to an area A of FIG. 3B for various transistors in accordance with some embodiments. FIGS. 4A to 4C show exemplary structures of the work function layer corresponding to area A of FIG. 3B for n-type transistors with different threshold voltages. In some alternatively embodiments, FIGS. 4D to 4E show exemplary structures of the work function layer corresponding to area A of FIG. 3B for p-type transistors with different threshold voltages.

FIG. 4A is exemplary cross-sectional view illustrating the structure of the work function layer of a first n-type FinFET N1 with a threshold voltage Vn1 (e.g., ultra-low voltage). FIG. 4B is exemplary cross-sectional view illustrating the structure of the work function layer of a second n-type FinFET N2 with a threshold voltage Vn2 (e.g., low-voltage). FIG. 4C is exemplary cross-sectional view illustrating the structure of the work function layer of a third n-type FinFET N3 with a threshold voltage Vn3 (e.g., standard voltage). Here, Vn1<Vn2<Vn3.

As shown in FIG. 4A, the structure of the work function layer of the first n-type FinFET N1 includes a first conductive layer 125, a first layer 202, and a second conductive layer 126 between the gate dielectric layer 102 and the metal filling layer 124.

In some embodiments, the first conductive layer 125 functions as a barrier or protective layer in the subsequent etching processes, is formed over the gate dielectric layer 102. In some embodiments, the first conductive layer 125 includes one or more layers of Ti, Ta, TiN and TaN. For example, the first conductive layer 125 may be a single TaN layer, or a composite layer of TaN layer formed over a TiN layer. The first conductive layer 125 is formed by performing a CVD process, an ALD process, or other suitable process. A thickness of the first conductive layer 125 is in a range from 5 Å to 25 Å, in some embodiments.

The first layer 202 is also referred as a first work function layer 200a. In some embodiments, the first layer 202 includes TiAl, TaAl, HfAl, or a combination thereof. In some embodiments, the first layer 202 includes one or more layers. The first layer 202 is formed by performing a CVD process, an ALD process, or other suitable process. A thickness of the first layer 202 is in a range from 15 Å to 50 Å, in some embodiments, and in a range from 25 Å to 40 Å in other embodiments.

In some embodiments, the second conductive layer 126 functions as an adhesive layer for the metal filling layer 124, and includes one or more layers of Ti, Ta, TiN and TaN. In one embodiment, a TiN layer is used as the second conductive layer 126. The second conductive layer 126 is formed by performing a CVD process, an ALD process, or other suitable process, for example. A thickness of the second conductive layer 126 is in a range from 25 Å to 45 Å, in some embodiments.

The material and forming method of the gate dielectric layer 102 and the metal filling layer 124 have been described in the foregoing paragraph. Thus, details thereof are omitted here.

As shown in FIG. 4B, the arrangement, material and forming method of the second n-type FinFET N2 are similar to the arrangement, material and forming method of the first n-type FinFET N1. Thus, details thereof are omitted here. A difference therebetween lies in that the structure of the work function layer of the second n-type FinFET N2 further includes a second layer 204. The second layer 204 is formed between the first conductive layer 125 and the first layer 202. In some embodiments, the first layer 202 and the second layer 204 are referred as a second work function layer 200b.

In some embodiment, the second layer 204 includes one or more layers of Ti, Ta, TiN and TaN. In one embodiment, the second layer 204 includes a TiN layer. In some embodiments, the second layer 204 and the first layer 202 include different materials. For example, the second layer 204 includes a base material and a dopant doped in the base material. The base material of the second layer 204 includes a metal nitride such as TiN, TaN or a combination thereof. The dopant includes a metal atom such as Al, Ta, W, or a combination thereof. The second layer 204 may be formed by doping Al elements into a TiN layer to form a TiAlN layer, for example. However, the embodiments of the present invention are not limited thereto. In some alternatively embodiments, the base material includes TiN, TaN, and the second layer 204 includes TiAlN, TaAlN, TiWN, TiN—Ta, or a combination thereof. A thickness of the second layer 204 is in a range from 7 Å to 15 Å, in some embodiments. The second layer 204 may be formed by performing an ALD process, will be described in detail in the following paragraphs.

As shown in FIG. 4C, the arrangement, material and forming method of the third n-type FinFET N3 are similar to the arrangement, material and forming method of the second n-type FinFET N2. Thus, details thereof are omitted here. A difference therebetween lies in that the structure of the work function layer of the third n-type FinFET N3 further includes a third layer 206, and the third layer 206 is formed between the first conductive layer 125 and the second layer 204. In some embodiments, the first layer 202, the second layer 204 and the third layer 206 are referred as a third work function layer 200c. In some embodiment, the third layer 206 includes one or more layers of Ti, Ta, TiN and TaN. In one embodiment, the third layer 206 includes a TiN layer. In some embodiments, the third layer 206 and the first layer 202 include different materials. For example, the third layer 206 includes a base material and a dopant doped in the base material. The base material of the third layer 206 may be the same as or different from the base material of the second layer 204. The base material of the third layer 206 includes a metal nitride such as TiN, TaN or a combination thereof. The dopant of the third layer 206 may be the same as or different from the dopant of the second layer 204. The dopant of the third layer 206 includes a metal atom such as Al, Ta, W, or a combination thereof. In some alternatively embodiments wherein the base material includes TiN, TaN, or a combination thereof, and the third layer 206 includes TiAlN, TaAlN, TiWN, TiN—Ta, or a combination thereof. The third layer 206 may be formed by performing an ALD process, will be described in detail in the following paragraphs. A thickness of the third layer 206 is in a range from 7 Å to 15 Å, in some embodiments. Two adjacent layers may be treated as one "thick" layer. For example, when the third layer 206 and the second layer 204 are formed of the same material (e.g., TiAlN), the third layer 206 and the second layer 204 may be treated as one "thick" layer (e.g., a thick TiAlN layer).

As shown in FIGS. 4A to 4C, the base materials of the second layer 204 and the third layer 206, and the dopants and the dopant concentrations of the second layer 204 to the third layer 206 may be the same or different. On the other hand, the thicknesses of the first to third work function layers 200a, 200b, 200c are different. In some embodiments, the thickness of the first work function layer 200a for the first n-type FinFET N1 is the smallest, while the thickness of the third work function layer 200c for the third n-type FinFET N3 is the largest, among the first to third n-type FinFETs N1, N2 and N3. As set forth above, by adjusting the thickness of the work function layer, threshold voltages (Vt) of the first to third n-type FinFETs N1, N2 and N3 may be adjusted to 0<Vn1<Vn2<Vn3. That is, the threshold voltages of the first to third n-type FinFETs N1, N2 and N3 increases as the total thickness of the first to third work function layers 200a, 200b, 200c increases.

In some embodiments, at least one of the second work function layer 200b and the third work function layer 200c includes a base material (e.g., TiN, TaN or a combination thereof) and a dopant doped in the base material, and the dopant comprises Al, Ta, W, or a combination thereof. In detail, at least one of the second layer 204 and the third layer 206 includes the base material (e.g., TiN, TaN, or a combination thereof) and a dopant doped in the base material. It should be noted that the work function layer having the dopant therein is able to achieve to a desired threshold voltage at a thicker thickness of the work function layer compared with the work function layer without the dopant. In other words, the work function layer having the dopant is able to prevent the film discontinuous and or non-uniform issue due to the ultra-thin file formation. In the case, the work function layer having the dopant is suitable for the next generation semiconductor device, such as the critical dimension of 16 nm, 10 nm, 7 nm, 5 nm, 3 nm or less.

In addition, the work function layer having the dopant may function as a blocking layer to prevent diffusion atoms (such as W, Al, F or O) diffusing from the metal filling layer into the gate dielectric layer or the interfacial layer. The diffusion atoms include metal atoms (such as W, Al) derived from the metal filling layer and/or residues (such as F or O) derived from a precursor of the metal filling layer and/or n work function layer, respectively. As a result, the issue of threshold voltage shift may be prevented or decreased.

FIG. 4D is exemplary cross-sectional view illustrating the structure of the work function layer of a first p-type FinFET P1 with a threshold voltage Vp1 (e.g., standard voltage). FIG. 4E is exemplary cross-sectional view illustrating the structure of the work function layer of a second p-type FinFET P2 with a threshold voltage Vp2 (e.g., low-voltage). FIG. 4F is exemplary cross-sectional view illustrating the structure of the work function layer of a third p-type FinFET P3 with a threshold voltage Vp3 (e.g., ultra-low voltage). Here, Vp1<Vp2<Vp3<0 V.

As shown in FIG. 4D, the arrangement, material and forming method of the structure of the work function layer of the first p-type FinFET P1 are similar to the arrangement, material and forming method of the structure of the work function layer of the third n-type FinFET N3. Thus, details thereof are omitted here. A difference therebetween lies in that the structure of the work function layer of the first p-type FinFET P1 further includes a fourth layer 208 formed between the first conductive layer 125 and the third layer 206. In some embodiments, the first layer 202, the second layer 204, the third layer 206, and the fourth layer 208 are referred as a fourth work function layer 200d. The fourth layer 208 includes one or more layers of Ti, Ta, TiN and TaN. In one embodiment, the fourth layer 208 includes a TiN layer. In some embodiments, the fourth layer 208 and the first layer 202 include different materials. For example, the fourth layer 208 includes a base material and a dopant doped in the base material. The base material of the fourth layer 208 may be the same as or different from the base material of the second layer 204. The base material of the fourth layer 208 includes a metal nitride such as TiN, TaN or a combination thereof. The dopant of the fourth layer 208 may be the same as or different from the dopant of the second layer 204. The dopant of the fourth layer 208 includes a metal atom such as Al, Ta, W, or a combination thereof. In some embodiments, the base material includes TiN, TaN, or a combination thereof, and the fourth layer 208 may include TiAlN, TaAlN, TiWN, TiN—Ta, or a combination thereof. A thickness of the fourth layer 208 is in a range from 7 Å to 15 Å, in some embodiments. The fourth layer 208 may be formed by performing an ALD process, will be described in detail in the following paragraphs.

As shown in FIG. 4E, the arrangement, material and forming method of the structure of the work function layer of the second p-type FinFET P2 are similar to the arrangement, material and forming method of the structure of the work function layer of the first p-type FinFET P1. Thus, details thereof are omitted here. A difference therebetween lies in that the structure of the work function layer of the second p-type FinFET P2 further includes a fifth layer 210 formed between the first conductive layer 125 and the fourth layer 208. In some embodiments, the first layer 202, the second layer 204, the third layer 206, the fourth layer 208, and the fifth layer 210 are referred as a fifth work function layer 200e. The fifth layer 210 includes one or more layers of Ti, Ta, TiN and TaN. In one embodiment, the fifth layer 210 includes a TiN layer. In some embodiments, the fifth layer 210 and the first layer 202 include different materials. For example, the fifth layer 210 includes a base material and a dopant doped in the base material. The base material of the fifth layer 210 may be the same as or different from the base material of the second layer 204. The base material of the fifth layer 210 includes a metal nitride such as TiN, TaN or a combination thereof. The dopant of the fifth layer 210 may be the same as or different from the dopant of the second layer 204. The dopant of the fifth layer 210 includes a metal atom such as Al, W, Ta, or a combination thereof. In some embodiments where the base material includes TiN, TaN, or a combination thereof, and the fifth layer 210 may include TiAlN, TaAlN, TiWN, TiN—Ta, or a combination thereof. A thickness of the fifth layer 210 is in a range from 7 Å to 15 Å, in some embodiments. The fifth layer 210 may be formed by performing an ALD process, will be described in detail in the following paragraphs.

As shown in FIG. 4F, the arrangement, material and forming method of the structure of the work function layer of the third p-type FinFET P3 are similar to the arrangement, material and forming method of the structure of the work function layer of the second p-type FinFET P2. Thus, details thereof are omitted here. A difference therebetween lies in that the structure of the work function layer of the third p-type FinFET P3 further includes a sixth layer 212 formed between the first conductive layer 125 and the fifth layer 210. In some embodiments, the first layer 202, the second layer 204, the third layer 206, the fourth layer 208, the fifth layer 210, and the sixth layer 212 are referred as a sixth work function layer 200f. The sixth layer 212 includes one or more layers of Ti, Ta, TiN and TaN. In one embodiment, the sixth layer 212 includes a TiN layer. In some embodiments, the sixth layer 212 and the first layer 202 include different materials. For example, the sixth layer 212 includes a base material and a dopant doped in the base material. The base material of the sixth layer 212 may be the same as or different from the base material of the second layer 204. The base material of the sixth layer 212 includes a metal nitride such as TiN, TaN or a combination thereof. The dopant of the sixth layer 212 may be the same as or different from the dopant of the second layer 204. The dopant of the fourth layer 208 includes a metal atom such as Al, Ta, W, or a combination thereof. In some embodiments where the base material includes TiN, TaN, or a combination thereof, and the sixth layer 212 may include TiAlN, TaAlN, TiWN, TiN—Ta, or a combination thereof. A thickness of the sixth layer 212 is in a range from 7 Å to 15 Å, in some embodiments. The sixth layer 212 may be formed by performing an ALD process, will be described in detail in the following paragraphs.

As shown in FIGS. 4D to 4F, the base materials, the dopants, the dopant concentrations of the fourth layer 208 to the sixth layer 212 may be the same or different.

As shown in FIGS. 4D to 4F, at least two adjacent layers made of the same material may be treated as one "thick" WFM layer. For example, when the sixth (fifth, fourth or third) to second layers are formed of the same material (e.g., TiAlN), the sixth (fifth, fourth or third) to second layers may be treated as one "thick" layer (e.g., a thick TiAlN layer).

As shown in FIGS. 4D to 4F, the thicknesses of the fourth to sixth work function layers 200d, 200e, 200f are different. Further, the thickness of the sixth work function layer 200f for the third p-type FinFET P3 is larger than the thickness of the fourth work function layer 200d for the first p-type FinFET P1, and larger than the thickness of the fifth work function layer 200e for the second p-type FinFET P2. In other words, the thickness of the fourth work function layer 200d for the first p-type FinFET P1 is the smallest, while the thickness of the sixth work function layer 200f for the third p-type FinFET P3 is the largest, among the first to third p-type FinFETs P1, P2, P3.

As shown in FIGS. 4A to 4F, in some embodiments, the first layer 202 is different from the base material of the second layer 204 to the sixth layer 212. The base materials of the second layer 204 to the sixth layer 212 may be the same or different, and the dopants and the dopant concentrations of the second layer 208 to the sixth layer 212 may be the same or different. In other words, the second to sixth work function layers 200a to 200f may have the same or different base materials, and the second to sixth work function layers 200b to 200f may have the same or different dopants and dopant concentrations. In other words, in some embodiments, at least one of the constituent atoms of the second layer 204 to the sixth layer 212 are the same as at least one of the constituent atoms of the first layer 202. In some other embodiments, at least two of the constituent atoms of the second layer 208 to the sixth layer 212 are the same as at least two of the constituent atoms of the first layer 202. In some other embodiments, at least two of the constituent atoms of the second layer 204 to the sixth layer 212 are the same as all of the constituent atoms of the first layer 202. For example, the second layer 204 to the sixth layer 212 are TiAlN, and the first layer 202 are TiAl.

As shown in FIGS. 4A to 4F, the total thickness of the work function layer increases in the order of the first to sixth work function layers 200a to 200f. As set forth above, by adjusting the thickness of the work function layer, threshold voltages (Vt) of the first to third n-type FinFETs N1, N2 and N3 may be adjusted to $0<Vn1<Vn2<Vn3$, and threshold voltages (Vt) for the first to third p-type FinFETs P1, P2, P3 may be adjusted to $Vp1>Vp2>Vp3$. That is, the threshold voltages of the first to third n-type FinFETs N1, N2 and N3 increases as the total thickness of the first to third work function layers 200a, 200b, 200c increases, while the threshold voltage of the first to third p-type FinFETs P1, P2, P3 decrease as the total thickness of the fourth to sixth work function layers 200d, 200e, 200f increases.

As shown in FIGS. 4A-4F, in some embodiments, at least one of the second to six layers 204, 206, 208, 210 and 212 includes the base material and the dopant doped in the base material, and the dopant includes a metal atom such as Al, Ta, W, or a combination thereof. The second to six layers 204, 206, 208, 210 and 212 may include different materials (e.g., TiAlN and TiN) or the same material (e.g., TiAlN or TiN). In some alternatively embodiments, all of the second to six layers 204, 206, 208, 210 and 212 includes the base material and the dopant doped in the base material, and the dopant includes Al, Ta, W, or a combination thereof. In some embodiments, the work function layers 200b to 200f for the second to third n-type FinFETs N2, N3 and the first to third p-type FinFETs P1, P2, P3 are made of the same material with different thicknesses. In the case, the thickness of the first work function layers 200a for the first n-type FinFET N1 is smallest, while the thickness of the sixth work function layers 200f for the third p-type FinFET P3 is the largest.

In addition, in some embodiments, the semiconductor device includes one or more n-type FinFETs with different threshold voltages and/or one or more p-type FinFETs with different threshold voltages.

In some embodiments, the three n-type FinFETs and three p-type FinFETs are disposed in a core area or an I/O (input/output) area, in other embodiments. A thickness of the gate dielectric layer in the core area is less than a thickness of the gate dielectric layer in the I/O area.

FIGS. 5A to 5D are exemplary cross-sectional views illustrating various stages of the sequential fabrication process of a gate structure in accordance with some embodiments. FIG. 6 is a flow chart illustrating a method of manufacturing a gate structure of a semiconductor device in accordance with some embodiments. In FIGS. 5A to 5D, the fabrication processes for metal gate structures for n-type FinFETs are illustrated, but substantially the same fabrication processes may be applied to p-type FinFETs.

Figure 5A:
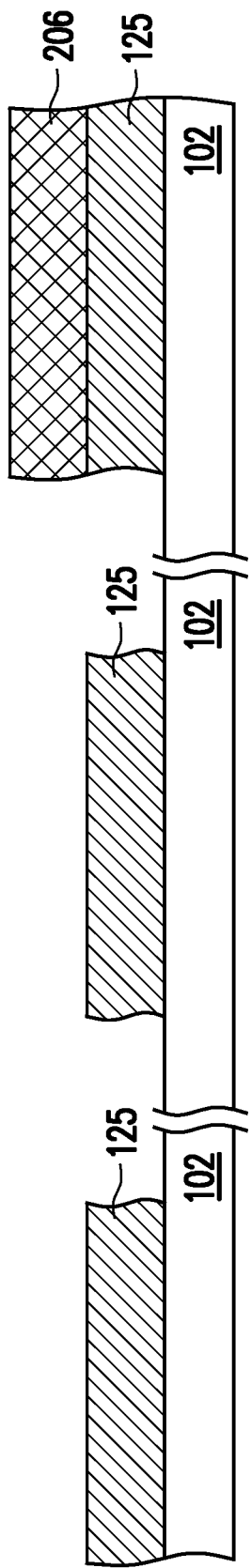
FIGS. 5A to 5D are exemplary cross-sectional views illustrating various stages of the sequential fabrication process of a gate structure in accordance with some embodiments.
Figure 5B:
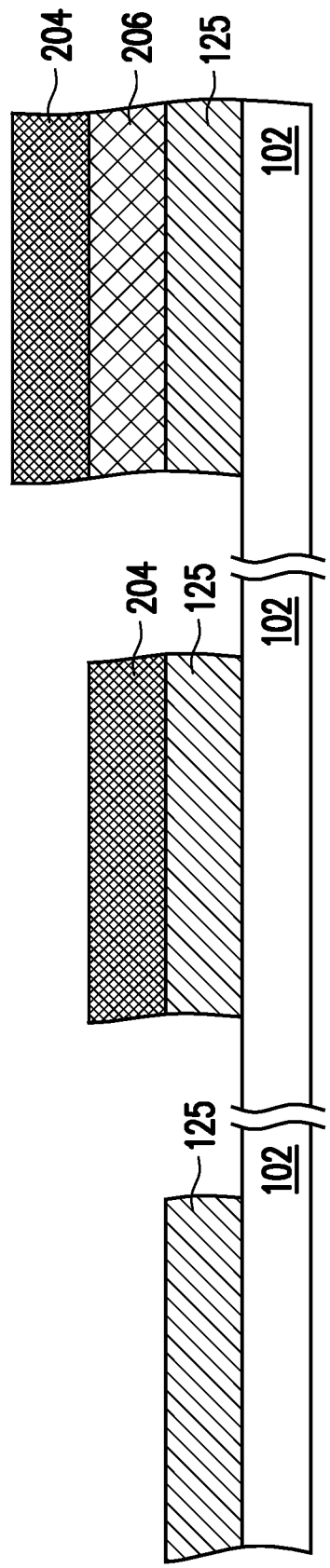
Figure 5C:
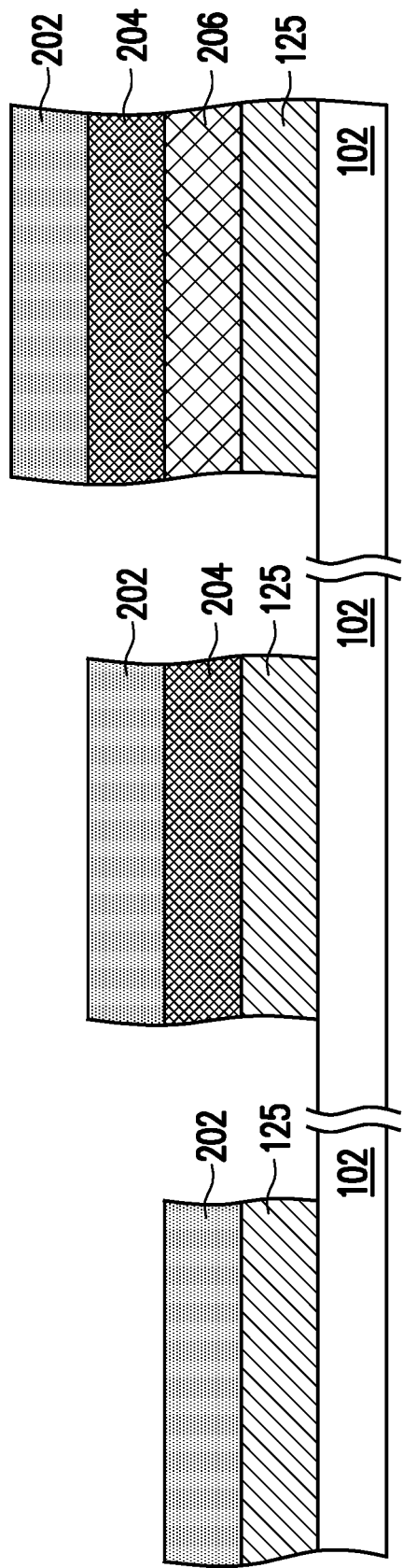
Figure 5D:
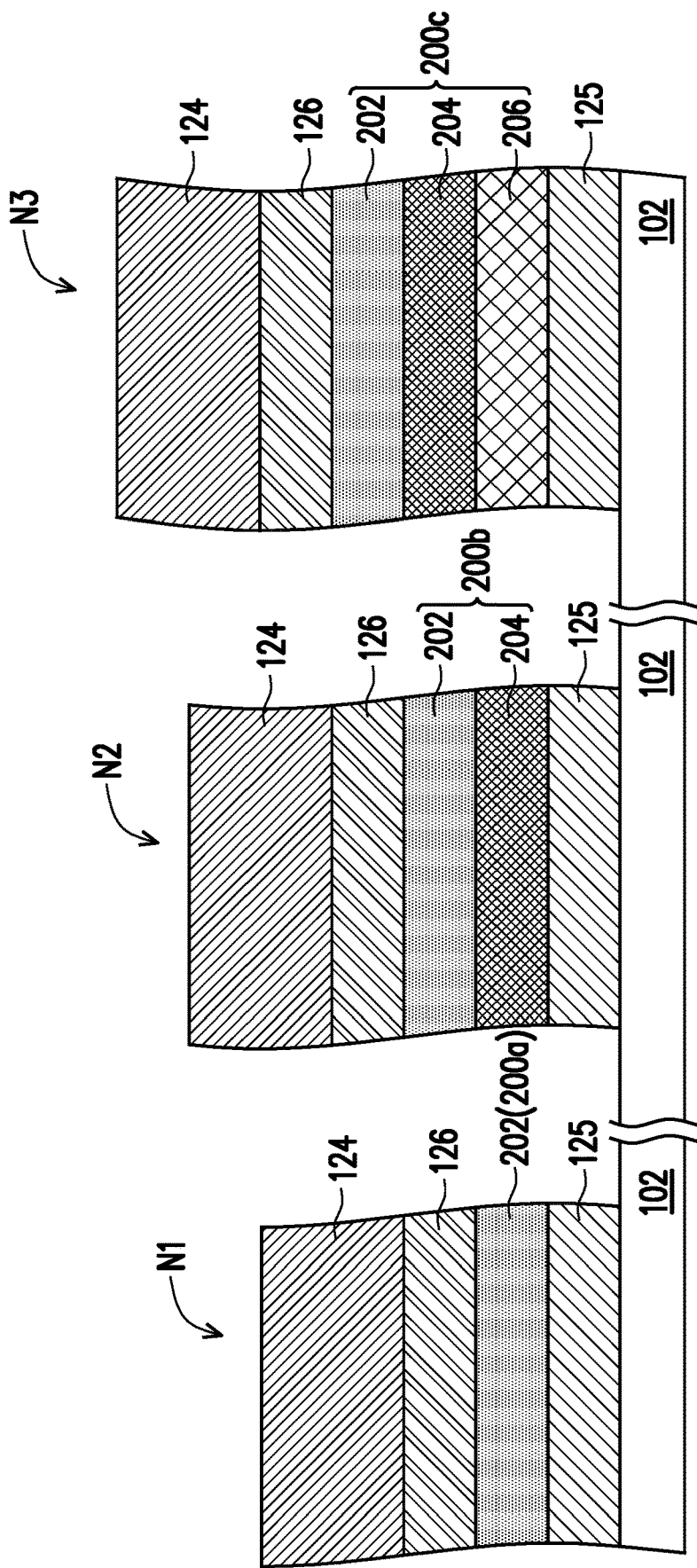
Figure 6:
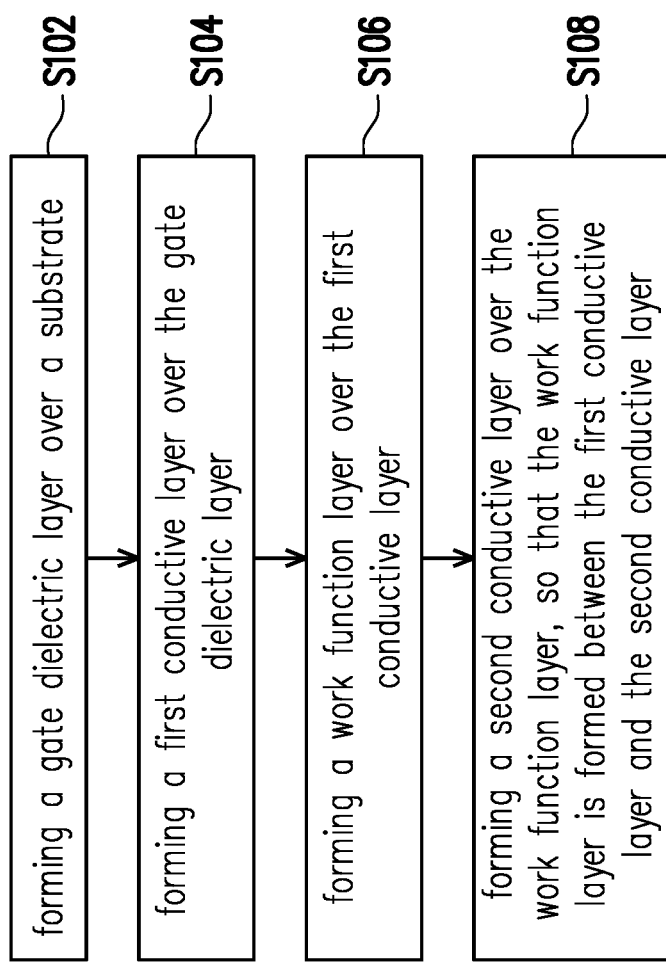
FIG. 6 is a flow chart illustrating a method of manufacturing a gate structure of a semiconductor device in accordance with some embodiments.

At Steps S102 and S104 in FIG. 6 and as shown in FIG. 5A, the gate dielectric layer 102 is formed over the substrate (not shown) and the first conductive layer 125 is formed over the gate dielectric layer 102. At Steps S106 and S108 in FIG. 6 and as shown in FIGS. 5B to 5D, the work function layer 200a, 200b and 200c for the first to third n-type FinFETs N1, N2 and N3 are formed over the first conductive layer 125 and the second conductive layer 126 is formed over the work function layer 200a, 200b and 200c.

In detail, as shown in FIG. 5A, the third layer 206 is formed over the first conductive layer 125 for the first to third n-type FinFETs N1, N2 and N3 (as shown in FIG. 5D). The third layer 206 formed on the first conductive layer 125 for the first and second n-type FinFETs N1 and N2 are removed by dry etching. By the dry etching, the first conductive layers 125 for the first and second n-type FinFETs N1 and N2 are exposed.

As shown in FIG. 5B, the second layer 204 is formed over the first conductive layer 125 for the first and second n-type FinFETs N1 and N2 and over the third layer 206 for the third n-type FinFET N3. Subsequently, the second layer 204 formed on the first conductive layer 125 for the first n-type FinFET N1 is removed by dry etching. By the dry etching, the first conductive layer 125 for the first n-type FinFET N1 is exposed.

As shown in FIG. 5C, the first layer 202 is formed over the first conductive layer 125 for the first n-type FinFET N1 and over the second layer 204 for the second and third n-type FinFETs N2 and N3. Subsequently, the second conductive layer 126 and the metal filling layer 124 are formed over the first layer 202, as shown in FIG. 5D.

In some embodiment, at least one of the second layer 204 and the third layer 206 includes the base material (e.g., TiN, TaN, or a combination thereof) and a dopant (e.g., Al, Ta, W, or a combination thereof) doped in the base material. For example, the Al dopants are doped into the TiN layer to form the TiAlN layer by the ALD process as an exemplary embodiment.

The ALD process includes repeating deposition loops, and each loop including a first cycle and a second cycle, in some embodiments. In detail, the first cycle is performed to form a metal nitride layer (e.g., the TiN layer). The first cycle includes using sources including a nitrogen source and Ti source. The nitrogen source includes $NH_3$, $N_2$, and $N_2O$, and the Ti source includes $TiCl_4$. Specifically, the first cycle includes following steps of introducing the nitrogen precursor for 0.2 seconds to 1 seconds, performing a first purge process for 0.2 seconds to 1 seconds, introducing the metal precursor for 0.1 seconds to 1 seconds, and performing a second purge process for 0.2 seconds to 1 seconds. In some embodiments, the first and second purge processes may be used to maintain cleanliness in the deposition chamber (e.g., to remove contaminants, particles, and other undesired matter from the deposition chamber) and to control a flow of gases in the deposition chamber. The controlling of the flow of gases may be used, for example, to remove precursor materials from the deposition chamber.

After the metal nitride layer (e.g., the TiN layer) is formed, the second cycle are performed by introducing an aluminum precursor on a surface of the metal nitride layer. In some embodiments, the aluminum precursor may be an organic precursor (e.g., trimethylaluminium (TMA)) or a non-organic precursor (e.g., aluminium chloride ($AlCl_3$)). Specifically, the second cycle includes following steps of introducing the aluminum precursor for 0.1 seconds to 1 seconds and performing a third purge process for 0.2 seconds to 1 seconds. After the second cycle are performed, Al atoms (or element Al) are doped or introduced into the TiN layer to form a first TiAlN layer as a first layer of the work function layer. After the loop including the first cycle and the second cycle is accomplished, the first cycle and the second cycle are repeated to form a second TiAlN layer, and/or a third TiAlN layer and so on until a thickness of the work function layer is achieved.

In some embodiments, each of the loops includes performing the first cycle once and performing the second cycle once. In some other embodiments, each of the loops includes performing the first cycle once and performing the second cycle twice for adjusting Al content. However, the disclosure is not limited thereto. In so alternative embodiments, the number of performing the first cycle and the number of performing the second cycle may be the same or different, in other embodiments.

In some alternatively embodiments, each loop includes the first cycle and a third cycle. The steps of the first cycle have been described in the foregoing paragraph. Thus, details thereof are omitted here. After the metal nitride layer (e.g., the TiN layer) is formed, the third cycle are performed by introducing another nitrogen precursor (e.g., $NH_3$ as nitrogen source) and an aluminum precursor (e.g., TMA or a $AlCl_3$) on the surface of the metal nitride layer to form a AlN layer over the TiN layer. In other words, the AlN layer and the TiN layer are in contact with each other to from a TiAlN layer as the work function layer. After the loop including the first cycle and the third cycle is accomplished, the first cycle and the third cycle are repeated to achieve a thickness of the work function layer. In some alternative embodiments, the number of performing the first cycle and the number of performing the third cycle may be the same or different, in other embodiments.

In some embodiments, the time of introducing the aluminum precursor may be less than 1 second which is referred as a short pulse. When the Al precursor is introduced with the short pulse, the formed TiAlN layer has better uniformity, better step coverage, and higher wafer per hour (WPH). That is, the process time of performing the ALD process with the short pulse is shortened, so that the throughput of forming the gate structure is faster. In some alternatively embodiments, parameters (e.g., temperature, power, flow rate or the like) of the ALD process may be adjusted based on the design and the requirements of the devices.

In addition, in some embodiments, the tensile stress of the work function layer decreases as the aluminum content increases. When the Al content increases, the crystal plane orientation of the TiAlN layer changes from <111> to <200>. The <200> crystal plane orientation has less tensile stress than the <111> crystal plane orientation. That is, the work function layer having the Al dopant is able to release the tensile stress of the whole gate structure and avoid the gate structure bending issue. In some alternatively embodiments, the work function layer having the dopant may be amorphous. In one embodiment, the Al content of the work function layer (e.g., the TiAlN layer) is in the range of 10 wt % and 18 wt %. However, the embodiments of the present invention are not limited thereto. In another embodiment, a ratio of the TiN to Al of the TiAlN layer is 1:1; while the ratio of the TiN to MN of the TiAlN layer is 1:2 to 2:1 (i.e., 1:2, 1:1, or 2:1), in other embodiments.

Although the above steps are doping the Al dopants into the TiN layer to form the TiAlN layer by the ALD process as an exemplary embodiment, it should not limit various embodiments of the present disclosure. In some alternative embodiments, the dopants may include Al, Ta, W or a combination thereof, and the base material comprises TiN, TaN, or a combination thereof. Therefore, the second layer or the third layer formed by doping the dopants into the base material by the ALD process may include TiAlN, TaAlN, TiWN, TiN—Ta, or a combination thereof. In one embodiment, the first cycle is performed to introduce a nitrogen precursor (e.g., NH$_3$, N$_2$, N$_2$O, or a combination thereof) and a first metal precursor (e.g., TiCl$_4$, TaCl$_5$, or a combination thereof) to form a metal nitride layer (e.g., TiN, TaN, or a combination thereof). A second cycle is then performed to introduce a second metal precursor (e.g., TMA, AlCl$_3$, TIBA, WF$_6$, TaCl$_5$, or a combination thereof) on a surface of the metal nitride layer. In another embodiment, a third cycle is performed to introduce a second nitrogen precursor (e.g., NH$_3$, N$_2$, N$_2$O, or a combination thereof) and a second metal precursor (e.g., TMA, AlCl$_3$, TIBA, WF$_6$, TaCl$_5$, or a combination thereof) on a surface of the metal nitride layer after the first cycle is performed.

In accordance with some embodiments of the present disclosure, a semiconductor device includes a first n-type FinFET and a second n-type FinFET. The first FinFET includes a first work function layer. The first work function layer includes a first portion of a first layer. The second n-type FinFET includes a second work function layer. The second work function layer includes a second portion of the first layer and a first portion of a second layer underlying the second portion of the first layer. A thickness of the first work function layer is less than a thickness of the second work function layer.

In accordance with alternative embodiments of the present disclosure, a semiconductor device includes a n-type FinFET. The n-type FinFET includes a gate structure between a pair of source and/or drain (S/D) regions. The gate structure includes a gate dielectric layer; a metal filling layer over the gate dielectric layer; and a work function layer between the gate dielectric layer and the metal filling layer. The work function layer is selected from a material in which a threshold voltage of the n-type FinFET increases as a thickness of the work function layer increases.

In accordance with yet alternative embodiments of the present disclosure, a method of manufacturing a semiconductor device includes: providing a substrate having a first region and a second region; forming a first conductive layer over the substrate in the first and second regions; forming a bottom material over the first conductive layer by doping a dopant in a base material in an atomic layer deposition (ALD) method, wherein the dopant comprises Al, Ta, W or a combination thereof; removing a portion of the bottom material to expose the first conductive layer in the first region and form a bottom layer over the first conductive layer in the second region; forming a top material to cover the first conductive layer in the first region and the bottom layer in the second region, wherein a first portion of the top material in the first region is formed as a first work function layer for a first FinFET, and a second portion of the top material in the second region and the bottom layer therebelow are formed as a second work function layer for a second FinFET; and forming a second conductive layer to cover the first and second work function layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first transistor of a first type comprising a first work function layer, the first work function layer comprising a first underlying layer; and
   a second transistor of the first type comprising a second work function layer, the second work function layer comprising a second underlying layer,
   wherein the first and second underlying layers, each comprises a metal nitride layer with at least two kinds of metals, and a thickness of the first underlying layer is greater than a thickness of the second underlying layer.

2. The semiconductor device of claim 1, wherein the at least two kinds of metals comprise a first metal comprising Ti, Ta, or a combination thereof, and a second metal comprising Al, Ta, W, or a combination thereof.

3. The semiconductor device of claim 2, wherein the first work function layer further comprises a first overlying layer overlaying the first underlying layer, the second work function layer further comprises a second overlying layer overlaying the second underlying layer, and the first and second overlying layers each comprises TiAl, TaAl, HfAl, or a combination thereof.

4. The semiconductor device of claim 3, further comprising a third transistor of the first type comprising a third work function layer, wherein third work function layer comprises a third overlying layer, and the third overlying layer comprises TiAl, TaAl, HfAl, or a combination thereof.

5. The semiconductor device of claim 4, wherein the first transistor has a threshold voltage Vn1, the second transistor has a threshold voltage Vn2, the third transistor has a threshold voltage Vn3, and $0<Vn3<Vn2<Vn1$.

6. The semiconductor device of claim 5, further comprising:
   a first transistor of a second type with a threshold voltage Vp1 comprising a fourth work function layer;
   a second transistor of the second type with a threshold voltage Vp2 comprising a fifth work function layer; and
   a third transistor of the second type with a threshold voltage Vp3 comprising a sixth work function layer.

7. The semiconductor device of claim 6, wherein the fourth work function layer comprises a fourth underlying layer, the fifth work function layer comprises a fifth underlying layer, and the sixth work function layer comprises a sixth underlying layer, and a thickness of the sixth underlying layer is greater than a thickness of the fifth underlying layer, and the thickness of the fifth underlying layer is greater than a thickness of the fourth underlying layer.

8. The semiconductor device of claim 7, wherein thickness of the fourth underlying layer is greater than the thickness of the first underlying layer.

9. The semiconductor device of claim 7, wherein $Vp1<Vp2<Vp3<0$.

10. The semiconductor device of claim 9, wherein a thickness of the sixth work function layer is greater than a thickness of the fifth work function layer, the thickness of the fifth work function layer is greater than a thickness of the fourth work function layer, the thickness of the fourth work function layer is greater than a thickness of the first work function layer, the thickness of the first work function layer is greater than a thickness of the second work function layer, and the thickness of the second work function layer is greater than a thickness of the third work function layer.

11. A semiconductor device, comprising:
a first transistor of a first type, comprising a first work function layer;
a second transistor of the first type, comprising a second work function layer;
a third transistor of the first type, comprising a third work function layer;
a fourth transistor of a second type, comprising a fourth work function layer;
a fifth transistor of the second type, comprising a fifth work function layer; and
a sixth transistor of the second type, comprising a sixth work function layer, wherein:
the first transistor, the second transistor and the third transistor have different threshold voltages, the fourth transistor, the fifth transistor and the sixth transistor have different threshold voltages,
at least one of the second work function layer, the third work function layer, the fourth work function layer, the fifth work function layer, and the sixth work function layer comprises a dopant, wherein the dopant comprises Al, Ta, W, or a combination thereof.

12. The semiconductor device of claim 11, wherein the first type comprises n-type, and the second type comprises p-type.

13. The semiconductor device of claim 11, wherein the dopant is doped in a base material and the base material comprises TiN, TaN, or a combination thereof.

14. The semiconductor device of claim 11, wherein the first work function layer, the second work function layer, the third work function layer, the fourth work function layer, the fifth work function layer, and the sixth work function layer each comprises an overlying layer, and the overlying layer comprises TiAl, TaAl, HfAl, or a combination thereof.

15. The semiconductor device of claim 11, wherein a thickness of is greater than a thickness of the fifth work function layer, the thickness of the fifth work function layer is greater than a thickness of the fourth work function layer, the thickness of the fourth work function layer is greater than a thickness of the first work function layer, the thickness of the first work function layer is greater than a thickness of the second work function layer, and the thickness of the second work function layer is greater than a thickness of the third work function layer.

16. The semiconductor device of claim 11, wherein the second work function layer, the third work function layer, the fourth work function layer, the fifth work function layer, and the sixth work function layer each comprises a multi-layer structure.

17. The semiconductor device of claim 16, wherein a number of layers of the multi-layer structure increases in the order of the second work function layer, the third work function layer, the fourth work function layer, the fifth work function layer, and the sixth work function layer.

18. A method of manufacturing semiconductor device, comprising:
forming a first transistor of a first type comprising a first work function layer, the first work function layer comprising a first underlying layer; and
forming a second transistor of the first type comprising a second work function layer, the second work function layer comprising a second underlying layer,
wherein the first and second underlying layers, each comprises a metal nitride layer with at least two kinds of metals, and a thickness of the first underlying layer is greater than a thickness of the second underlying layer.

19. The method of claim 18, wherein the at least two kinds of metals comprise a first metal comprising Ti, Ta, or a combination thereof, and a second metal comprising Al, Ta, W, or a combination thereof.

20. The method of claim 19, wherein the first work function layer further comprises a first overlying layer overlaying the first underlying layer, the second work function layer further comprises a second overlying layer overlaying the second underlying layer, and the first and second overlying layers each comprises TiAl, TaAl, HfAl, or a combination thereof.

\* \* \* \* \*